United States Patent [19]

Ostop et al.

[11] 3,935,587

[45] Jan. 27, 1976

[54] HIGH POWER, HIGH FREQUENCY BIPOLAR TRANSISTOR WITH ALLOYED GOLD ELECTRODES

[75] Inventors: John A. Ostop; Paul M. Kisinko, both of Greensburg, Pa.; Joseph F. Henry, Palatine, Ill.

[73] Assignee: Westinghouse Electric Corporation, Pittsburgh, Pa.

[22] Filed: Aug. 14, 1974

[21] Appl. No.: 497,349

[52] U.S. Cl. .................. 357/34; 357/36; 357/63
[51] Int. Cl.² .............. H01L 29/72; H01L 29/167; H01L 29/207; H01L 29/227
[58] Field of Search ............ 357/34, 38, 39, 52, 53, 357/63, 36

[56] References Cited
UNITED STATES PATENTS

| | | | |
|---|---|---|---|
| 2,858,489 | 10/1958 | Henkels | 357/36 |
| 2,924,760 | 2/1960 | Herlet | 357/68 |
| 2,936,410 | 5/1960 | Emeis et al. | 357/34 |
| 2,946,709 | 7/1960 | Herlet | 357/34 |
| 3,460,009 | 8/1969 | Kisinko et al. | 357/89 |
| 3,872,494 | 3/1975 | Davis et al. | 357/34 |

FOREIGN PATENTS OR APPLICATIONS

| 640,068 | 4/1962 | Canada | 357/34 |
|---|---|---|---|

*Primary Examiner*—Martin H. Edlow
*Assistant Examiner*—Gene M. Munson
*Attorney, Agent, or Firm*—C. L. Menzemer

[57] ABSTRACT

A bipolar transistor is provided with both high voltage and high frequency capabilities. A semiconductor body of a resistivity between 10 and 100 ohm-cm forms the collector region of the transistor and has an epitaxial semiconductor layer grown on a major surface thereof of a resistivity between about 0.5 and 10 ohm-cm and of a thickness between about 20 and 100 microns and of a conductivity type opposite from the body. At least one emitter region and integral emitter electrode are alloyed into the epitaxial layer preferably in annular rings. A base region is formed in the epitaxial layer between the emitter and semiconductor body and around the emitter region, said base region having a minimum thickness between the emitter region and the semiconductor body in the interior of the body of less than 20 and preferably between 5 and 10 microns. Base electrodes are alloyed into the epitaxial layer preferably spaced from the emitter region and emitter electrode preferably in concentric annular rings and a center circular member.

10 Claims, 5 Drawing Figures

HIGH POWER, HIGH FREQUENCY BIPOLAR TRANSISTOR WITH ALLOYED GOLD ELECTRODES

FIELD OF THE INVENTION

The present invention relates to semiconductor devices and particularly transistors.

BACKGROUND OF THE INVENTION

Bipolar transistors are old and well known in the art. Generally, a bipolar transistor is disposed in a semiconductor body having opposed major surfaces. It has emitter and collector regions formed of impurity of one conductivity type adjoining the separate opposed major surfaces, and a base region formed of impurity of the opposite conductivity type at least partially in the interior of the semiconductor body between the emitter and collector regions. Two PN junctions are thus formed in the semiconductor body, one at the transition between the emitter and base regions and one at the transition between the collector and base regions.

Bipolar transistors with high power capability have been generally restricted to low frequency operation, i.e., below 2 megahertz. This restriction is because of the competing requirements for impurity concentration uniformity in the base and for narrow base widths, e.g. 5–10 microns, for high power, high frequency operation. The cut-off frequency response is directly proportional to $D/X_B^2$, where D is the minority carrier diffusion length in the base region and $X_B$ is the thickness of the base region. Therefore, the thicker the base, the lower is the cut-off frequency for the transistor.

Single alloyed transistors (that is, where the collector and emitter regions are simultaneously alloyed) have been typically made to provide high power devices (i.e., a large safe operating area) for operation in the 0.5 – 1.0 megahertz frequency range. Such alloyed devices provide rugged performance for regulating, controlling and switching applications in that frequency range. However, the base widths of such alloyed devices are typically not narrower than about 50 microns because the alloying depth can be controlled to only ±5 microns and the thickness of commercial semiconductor wafers is controlled to only ±2.5 microns. The margin of error is too great to permit narrower base widths and still provide commercially acceptable manufacturing yields. Therefore, alloyed transistors have been practically restricted to cut-off frequencies below about 1 megahertz.

Single-diffused transistors (that is, where the emitter and collector regions are simultaneously diffused) have resulted in high power devices capable of operation in the 1 to 2 megahertz range. However, the base widths of such single-diffused transistors are typically greater than 20 microns because the deep diffusion that is required can be controlled to only ±2 microns and again the thickness of commercial semiconductor wafers is controlled to only ±2.5 microns. Again the margin of error is too great to permit narrower base widths and still provide commercially acceptable manufacturing yields.

Transistors with cut-off frequencies above 2 megahertz have, of course, been commercially made by double diffusion and epitaxial single diffusion techniques. However, the power capacity of such devices are low. In the double diffused transistor (that is, where the base and emitter regions are sequentially diffused), the impurity concentration is not axially uniform and in turn the base cannot carry as high a current density because of the resulting electric field gradient and minority carrier acceleration.

Moreover, the higher the frequency is, the higher the current density which must be carried by the transistor to attain a given power level. And the higher the current density and the narrower the base width, the more susceptible the transistor is to thermal runaway. That is, the electrical characteristics of the transistor vary from area to area resulting in non-uniform current densities. This non-uniformity in turn causes increased current densities in the area of highest density, resulting in localized overheating and eventually catastrophic breakdown and failure.

Therefore, even epitaxial base diffused emitter transistors have been limited in their power capacity. For this reason, a plurality of transistors are usually connected in parallel to provide for high power, high frequency operation. Such parallel operation, however, drastically lowers the input impedance of the transistor at high frequencies and in turn cause instability in the operation of the transistor. Further, this impedance decrease, correspondingly increases the Q of the device and makes impedance matching with external circuits exceedingly difficult without added complex circuitry.

A related problem in high power, high frequency operation is the size of the emitter contact to meet the high current requirements for high current density operation. The emitter contact has the same power handling requirements as the collector contact. Yet an epitaxial base diffused emitter transistor typically employs an emitter contact of evaporated aluminum of only about 3–7 microns in thickness. Similarly, a single diffused transistor typically employs an emitter contact of titanium-nickel alloy of only 1.5–2.5 microns in thickness, coated with 95 percent tin —5 percent lead alloy solder. These contacts are not adequate to carry the high current levels needed for high current density, high frequency operations.

The present invention overcomes these difficulties and disadvantages. It provides a high power transistor capable of operation in the 2–10 megahertz range. The invention utilizes the advantages of alloy transistors in high current emitter contacts while eliminating the problem in alloy transistors of base width control. Further, the invention provides a transistor which can readily be made with presently available production apparatus for making commercial transistors.

SUMMARY OF THE INVENTION

A bipolar transistor with both high power and high frequency capabilities is provided with a semiconductor body of a given conductivity type having first and second opposed major surfaces. The semiconductor body has a resistivity therethrough of between about 10 and 100 ohm-cm and preferably between about 30 and 50 ohm-cm, and a thickness preferably between 100 and 150 microns. The semiconductor body forms the collector region for the transistor.

An epitaxial semiconductor layer of conductivity type opposite from the semiconductor body is grown on the first major surface of the semiconductor to form a PN junction therewith. The epitaxial layer has a major surface, has a resistivity between about 0.5 and 10 ohm-cm, and preferably between 2 and 3 ohm-cm, and has a thickness between about 20 and 100 microns.

At least one emitter electrode, preferably in concentric annular rings of doped gold, is alloyed into the epitaxial layer adjacent the major surface thereof to form at least one emitter region of a conductivity type opposite from the base region with an integral electrode. Each emitter region thus forms a PN junction with the original impurity of the epitaxial layer. A base region is thus also formed from the original impurity grown into the epitaxial layer between the emitter region and the semiconductor body interior of the epitaxial layer and adjoining the major surface of the epitaxial layer around the emitter regions. The base region in the interior of the epitaxial layer between the semiconductor body and the emitter region has a minimum thickness less than 20 microns and preferably between 5 and 10 microns.

At least one gate electrode is alloyed to the base region at the major surface of the epitaxial layer spaced from the emitter electrode and emitter region. The gate electrodes are preferably one central contact and at least one and most desirably at least two annular rings concentrically positioned about and between the emitter electrodes which are annular rings, with one of the annular rings being peripheral of all emitter electrodes. Preferably, the gate electrodes are composed of doped gold.

To complete the transistor, a collector electrode is affixed to the second major surface of the semiconductor body preferably by alloying to make ohmic contact to the semiconductor body and the collector region of the transistor formed thereby.

Other details, objects and advantages of the invention will become apparent as the following description of the presently preferred embodiments thereof and the presently preferred methods for making and practicing the same proceeds.

BRIEF DESCRIPTION OF THE DRAWINGS

In the accompanying drawings, the presently preferred embodiments of the invention and the presently preferred methods for making and practicing the same are shown, in which.

DESCRIPTION OF THE PREFERRED EMBODIMENTS

Figure 1:
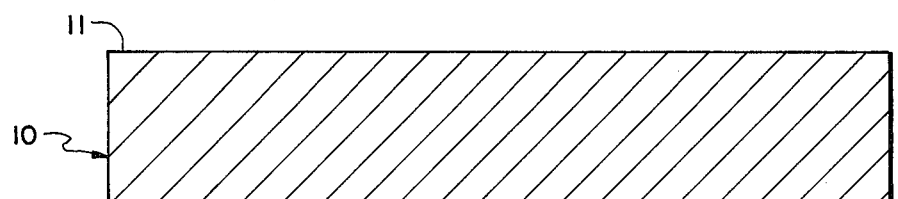
FIGS. 1 through 4 are cross-sectional views in elevation of a transistor of the present invention at various stages in its fabrication.

Referring to FIG. 1, a bipolar transistor of the present invention is made starting with a semiconductor body 10 having first and second opposed major surfaces 11 and 12. The present invention may be embodied in either an NPN transistor or a PNP transistor. However, for purposes of illustration, the description shall be with respect to an NPN transistor, with the understanding that the invention may be similarly embodied with a PNP transistor.

Accordingly, semiconductor body 10 is typically a commercially available N-type silicon wafer substantially uniformly doped with antimony, arsenic or phosphorus. Body 10 has a resistivity between 10 and 100 ohm-cm and typically between 30 and 50 ohm-cm. Semiconductor body 10 may have a thickness as small as 50 microns, but handling problems result with such small thicknesses and quantitative yields are low. Preferably, the thickness of body 10 is between 100 and 150 microns. Body 10 is preferably not over 150 microns because of the bulk resistance and accompanying charge storage that reduces the high frequency operation of the device. However, for high voltage operation, a trade off may be desired so that the high voltage may be supported. Body 10 is the collector region of the transistor fabricated as hereinafter described.

Figure 2:
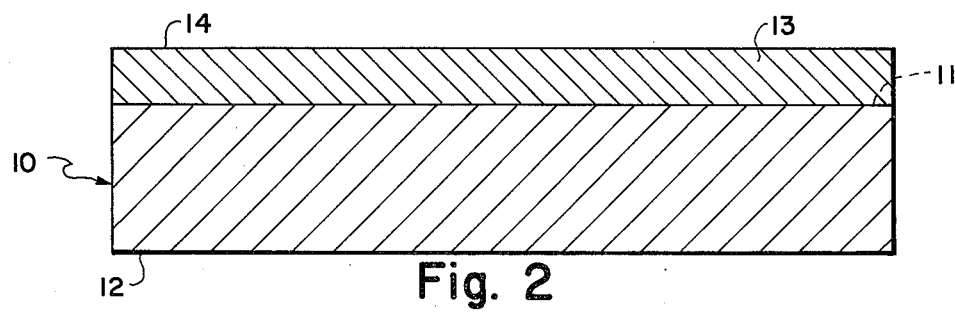

Referring to FIG. 2, fabrication of the transistor is commenced by growing epitaxial layer 13 on major surface 11 of body 10. Body 10 is first prepared for epitaxial growth by first mechanically and chemically polishing major surface 11 of body 10 preferably to crystallographic orient major surface 11 in the [100] crystallographic plane or 2° off from the [111] crystallographic plane of the single-crystal silicon. Semiconductor body 10 and particularly major surface 11 is then cleaned by any one of the well known cleaning techniques. For example, body 10 and particularly major surface 11 may be cleaned by degreasing in acetone and tetrachloroethylene and thereafter boiling in sulfuric-nitric acid ($H_2SO_4:HNO_3;3:1$). Semiconductor body 10 may then be chelated using ammoniumethylenediaminetetracetate, which is a complexing agent for removing metal ions from the semiconductor surfaces. After degreasing, boiling and chelating, the semiconductor body is rinsed extensively in Super-Q water, i.e., continuously recycled deionized water.

Following an in situ hydrogen chloride etch, epitaxial layer 13 is grown on major surface 11 of silicon body 10. The epitaxial growth is preferably performed in a horizontal reactor with an external RF induction heater at a temperature between 1100° and 1250°C. Silicon is, for example, deposited by reaction of silicon tetrachloride ($SiHl_4$) in hydrogen carrier gas. The epitaxial growth is continued until semiconductor layer 13 reaches a thickness preferably greater than 20 microns and less than 100 microns to ±0.5 micron, with 35 ± 0.5 microns being most typical. The thickness of epitaxial layer 13 is, of course, determined by the desired thickness for the base region of the transistor keeping in mind the removal of a certain part of the epitaxial layer in preparation for alloying and the alloying depth of the emitter region as hereinafter described.

Epitaxial layer 13 ultimately forms the base region of the transistor and therefore has a resistivity between 0.5 and 10 ohm-cm, with 2 to 3 ohm-cm being typical. The epitaxial layer is doped with a P-type impurity being of opposite type conductivity from the semiconductor body. The doping of the epitaxial layer 13 is provided by introducing a gas or vapor containing the desired P-type impurity into the epitaxial system during growth. Suitable gases and vapors for introduction of boron impurity are boron oxide ($B_2O_3$), boron tribromide ($BBr_3$) and diborane ($B_2H_6$). The doping may be similarly performed with vapors and gases of other P-type impurities such as gallium and/or aluminum.

Thereafter, major surface 14 of epitaxial layer 13 is prepared for alloying of the emitter region so that the surface is wettable with the alloying metal without spreading of the metal. These alloying preparation procedures are well known. A typical procedure is a light sandblast followed by a light etch. A suitable etchant for this purpose is a solution of 15 parts of 70 percent nitric acid solution, 3 parts of 49 percent hydrofluoric acid solution and 5 parts of 100 percent acetic acid. The surface preparation for alloying typically removes about 10 microns from the epitaxial layer 13 so that the epitaxial layer prepared for alloying has a thickness preferably between 15 and 90 microns, with 25 microns being typical.

Figure 3:
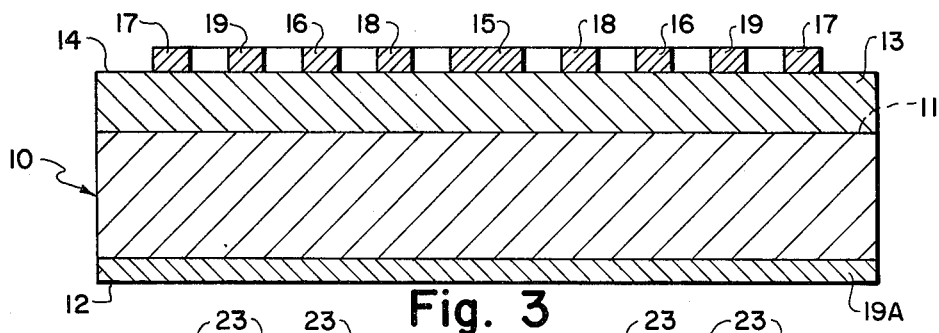
Figure 4:
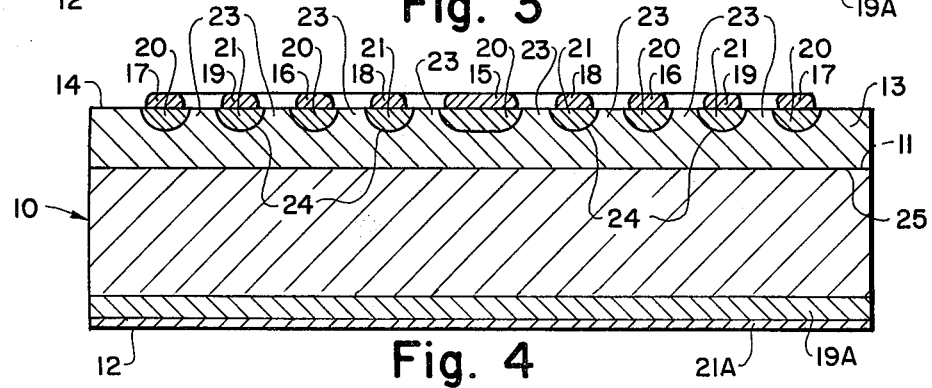

Referring to FIG. 3, base electrodes 15, 16 and 17 and emitter electrodes 18 and 19 are interlaid and aligned on major surface 14 of epitaxial layer 13 preparatory to alloying. Electrode 15 is typically a circular center contact typically of about 100–150 mils in diameter and about 25–40 microns in thickness. Electrodes 16, 17, 18 and 19 are annular rings typically of about 30 mils in width and about 25–40 microns in thickness. The rings are equally spaced preferably between about 125 and 250 microns apart and from center electrode 15, with 125 microns being typical.

Collector electrode 19A of circular shape is also preferably aligned over second major surface 12. The collector electrode is circular in shape having a diameter greater than semiconductor body 10 and a thickness typically of about 25–40 microns.

The electrodes are typically composed of gold and are doped with N or P-type impurity as desired. Base electrodes 15, 16 and 17 form highly doped regions 20 in epitaxial layer 13 and make good ohmic contact to the base region of the transistor. Emitter electrodes 18 and 19 form emitter regions 21 with integral emitter electrodes for the transistor in epitaxial layer 13 adjacent major surface 14, with the base region adjoining major surface 14 around them. And collector electrode 19A forms highly doped region 21A in semiconductor body 10 adjacent major surface 12 and makes good ohmic contact to the collector region of the transistor.

The alloying is typically performed by disposing the structure, with the aligned electrodes in place, in an RF induction furnace at about 700°C for 3 to 7 minutes, with 5 minutes being most typical. With this time and temperature, the alloying front will move into epitaxial layer 13 to between about 15 and 25 microns ±2.5 microns, with 20 ± 0.5 microns being typical. The alloying may be carried to greater depths by heating to higher temperatures, i.e., 800° to 850°C, for the same or slightly longer times. However, alloying is not carried to a depth greater than 50 to 65 microns because of difficulty in controlling the alloying front and the reduction in yield that results.

Thereafter, the transistor is passivated, encapsulated and packaged according to commercial procedures well known in the art.

Figure 5:
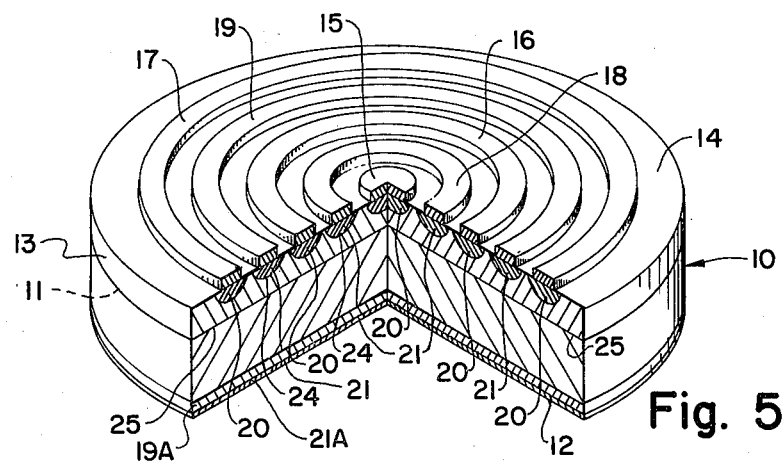
FIG. 5 is a perspective view with portions cut-away of the finished transistor shown in FIGS. 1 through 4.

Referring to FIG. 5, the completed transistor is shown resulting from the fabrication. The epitaxial growth and alloying results in two PN junctions 24 and 25 being formed, one at the major surface 11 between body 10 and epitaxial layer 13 and the other at the alloy front between emitter regions 21 and the epitaxial layer 13.

The high frequency operation is determined primarily by the thickness of the base region, which is the minimum distance between the emitter regions 21 and semiconductor body 10 in interior portions of the epitaxial layer 13. That is, the minimum thickness of the base region is less than 20 microns and preferably between about 5 and 10 microns, with 7.5 microns being typical. This thickness corresponds to a frequency range of 2 to 10 megahertz.

The high power capability results from the metallurgical structure at the alloyed emitter electrodes. The safe operating area (SOA) for the device is between 5 and 50 amperes, and between 100 and 300 volts. The safe operation range may even go as high as 700–1000 volts where the collector thickness is larger and the operating frequencies are lower. The thickness of the collector region does effect the frequency range of operation of the transistor because of the accumulated stored charge; however, the stored charge in the collector is 2 to 3 orders of magnitude less in its effect on the frequency range of operation than the base width.

In this connection, the 50 ampere restriction on the safe operating range is determined by the alignment of the electrode rings and the maximum size of the semiconductor body. Generally, the electrode rings cannot be physically spaced less than about 125 microns apart without seriously impairing yield, and silicon wafers are not commercially available that are greater than about 450 mils (i.e., about 11,250 microns) in diameter for the thickness required. These specifications put a practical limit of about 5 electrode rings that can be utilized in the structure. In this connection it should be noted that a base electrode ring is positioned peripherally of the outermost emitter electrode for good performance.

While the preferred embodiments of the invention have been shown and described with particularity, it is distinctly understood that the invention may be otherwise variously embodied and used within the scope of the following claims.

What is claimed is:
1. A bipolar transistor with high power and high frequency capabilities comprising:
   A. semiconductor body of a given conductivity-type having first and second opposed major surfaces, said body having a resistivity therethrough of between about 10 and 100 ohm-cm to form a collector region for a transistor;
   B. an epitaxial semiconductor layer of conductivity type opposite from the body disposed on said first major surface of the body, said epitaxial layer having a major surface thereon, having a resistivity between about 0.5 and 10 ohm-cm and having a thickness between about 20 and 100 microns;
   C. at least one emitter region and integral emitter electrode alloyed into the epitaxial layer adjacent the major surface thereof, said emitter region being of opposite conductivity type from the epitaxial layer;
   D. a base region for the transistor in the interior of the epitaxial layer adjoining each emitter region and the semiconductor body and adjoining the major surface of the epitaxial layer around the emitter region, said base region in interior portions adjoining the emitter region having a minimum thickness less than 20 microns;
   E. a gate electrode alloyed to the base region at the major surface of the epitaxial layer spaced from the emitter electrode and emitter region; and
   F. a collector electrode alloyed to the second major surface of the semiconductor body and making ohmic contact with the semiconductor body.
2. A bipolar transistor with high power and high frequency capabilities as set forth in claim 1 wherein: the emitter and base electrodes are doped gold.
3. A bipolar transistor with high power and high frequency capabilities as set forth in claim 1 wherein: the emitter electrode is at least one annular ring, and the gate electrode is one central contact and at least one annular ring positioned concentrically about the emitter electrode, one said ring of said gate electrode being peripheral of all said emitter electrodes.

4. A bipolar transistor with high power and high frequency capabilities as set forth in claim 3 wherein:
the emitter electrode is at least two annular rings and the gate electrode comprises at least two annular rings, said annular rings of the emitter electrode being positioned concentrically about and between the annular rings of the base electrode.

5. A bipolar transistor with high power and high frequency capabilities as set forth in claim 4 wherein:
the emitter and base electrodes are doped gold.

6. A bipolar transistor with high power and high frequency capabilities comprising:
A. semiconductor body of a given conductivity type having first and second opposed major surfaces, said body having a resistivity therethrough of between about 10 and 100 ohm-cm to form a collector region for a transistor;
B. an epitaxial semiconductor layer of conductivity type opposite from the body disposed on said first major surface of the body, said epitaxial layer having a major surface thereon, having a resistivity of between about 0.5 and 10 ohm-cm and having a thickness between about 20 and 100 microns;
C. at least one emitter region and integral emitter electrode alloyed into the epitaxial layer adjacent the major surface thereof, said emitter region being of opposite conductivity type from the epitaxial layer;
D. a base region for the transistor in the interior of the epitaxial layer adjoining the emitter region and the semiconductor body and adjoining the major surface of the epitaxial layer around the emitter region, said base region in interior portions adjoining the emitter region having a minimum thickness between about 5 and 10 microns;
E. a gate electrode alloyed to the base region at the major surface of the epitaxial layer spaced from the emitter electrode and emitter region; and
F. a collector electrode alloyed to the second major surface of the semiconductor body and making ohmic contact with the semiconductor body.

7. A bipolar transistor with high power and high frequency capabilities as set forth in claim 6 wherein:
the emitter and base electrodes are doped gold.

8. A bipolar transistor with high power and high frequency capabilities as set forth in claim 6 wherein:
the emitter electrode is at least one annular ring, and the gate electrode is one central contact and at least one annular ring positioned concentrically about the emitter electrode, one said ring of said gate electrode being peripheral of all said emitter electrodes.

9. A bipolar transistor with high power and high frequency capabilities as set forth in claim 8 wherein:
the emitter electrode is at least two annular rings and the gate electrode comprises at least two annular rings, said annular rings of the emitter electrode being positioned concentrically about and between the annular rings of the base electrode.

10. A bipolar transistor with high power and high frequency capabilities as set forth in claim 9 wherein:
the emitter and base electrodes are doped gold.

* * * * *